US005838550A

United States Patent [19]

Morris et al.

[11] Patent Number: 5,838,550

[45] Date of Patent: Nov. 17, 1998

[54] GROUNDING CLIP FOR SHIELDED MODULAR CONNECTOR

[75] Inventors: Terrel L. Morris, Garland; Eric C. Peterson, McKinney; Jeffrey N. Metcalf, Plano, all of Tex.

[73] Assignee: Hewlett-Packard Company, Palo Alto, Calif.

[21] Appl. No.: 919,461

[22] Filed: Aug. 28, 1997

[51] Int. Cl.$^{6}$ .......... H05K 9/00

[52] U.S. Cl. .......... 361/818; 361/753; 361/800; 174/35 GC; 174/35 C; 439/939

[58] Field of Search .......... 361/683, 684, 361/686, 740, 741, 753, 756, 759, 788, 799, 800, 816, 818; 174/35 R, 35 C, 35 GC, 51; 439/92, 95, 108, 607, 609, 939

[56] References Cited

U.S. PATENT DOCUMENTS 4,816,612 3/1989 Yeom .......... 174/35 R
5,686,695 11/1997 Chan .......... 174/35 GC

*Primary Examiner*—Leo P. Picard
*Assistant Examiner*—John B. Vigushin
*Attorney, Agent, or Firm*—Edward L. Miller

[57] ABSTRACT

A shortened ground path for the shield of a shielded modular connector (e.g., RJ-45, etc.) mounted against a bracket that is to be seated against a slot in a chassis is provided by a metallic grounding clip that slips over the bracket. The clip has edges that have been folded to slidably engage the bracket, and an orifice shaped to match the opening of the modular jack, so that the modular plug may pass through that orifice as it mates with the jack. The clip also has two opposing curved metal contacts along the perimeter of the orifice that engage and bear against the exposed shield portion of the modular plug as it mates with the modular jack. A pair of metal tabs engage the opening of the modular jack to align, or register, the orifice in the clip with the opening of the jack, and prevent the clip from easily sliding along the bracket once registration has been achieved. Since the grounding clip is as wide as the bracket, when the circuit assembly (I/O board) having the bracket is installed in the chassis the clip contacts the chassis directly, just as the bracket does. But the clip is also in direct contact with the shield of the modular plug whenever it is connected to the jack. Thus the grounding clip provides a direct path from the shield on the modular plug to the chassis.

5 Claims, 3 Drawing Sheets

GROUNDING CLIP FOR SHIELDED MODULAR CONNECTOR

BACKGROUND OF THE INVENTION

Computer equipment and its associated data communication equipment continue to operate at ever higher clock frequencies and data rates. Regulatory agencies in various jurisdictions around the globe have increasingly strict standards regarding electromagnetic emissions (EMI) which commercial and consumer grade equipment must meet if the equipment is to be sold in those jurisdictions. On the other hand, decreasing cost for a given level of performance is a customer expectation, so that for example, network connections made with fully shielded coaxial connectors (e.g., type N or BNC) is no longer economically desirable for new installations. This has produced a rise in popularity in twisted pair cable and their associated modular connectors, such as RJ-45. These connectors are also available in shielded versions that are used with shielded cable. The shielding is not so much to enhance the transmission line aspect of the cable; the twisted pairs therein are already suitable as transmission lines. The shield around the cable and the shielding on the modular connectors is to reduce EMI.

The shielding is not perfect, especially where the modular plug enters the modular jack. There are probably several reasons for this, but a significant one is the length of conductor that is required to pass through the modular jack, onto a circuit board assembly and thence to a chassis ground. (To the extent that the ground path is inductive for a signal, that signal is not shielded). Often that chassis ground is a metal bracket to which the circuit board is fastened at one end, and which, when installed in a computer or other equipment is in metal to metal contact with a slot in the main chassis of that computer or other equipment. Any connectors, such as the shielded RJ-45 under consideration, are mounted against an opening in the end bracket. The ground path for the shielded plug would be shorter, and therefore less inductive, if the external metal shield of the modular plug could be connected directly to chassis metal beyond the perimeter of the slot in the main chassis.

Some commercially available shielded version of the RJ-45 connector have internal to the jack one or as many as two spring clips that bear against an exposed shield portion of the plug when the two are mated. Because of their location, these springs are thin, and are often inadequate, since they tend to get flattened through repeated cycles of insertion of the plug or through subsequent movement of the cable/plug combination after mating. This produces an unreliable ground connection for the shield, which, of course, severely compromises EMI performance. And even when it works, it is still part of the long inductive path described above.

SUMMARY OF THE INVENTION

A solution to the problem of improving the ground path for the shield of a shielded modular connector mounted against a bracket that is to be seated against a slot in a chassis is to provide a metallic grounding clip that slips over the bracket. The clip has edges that have been folded to slidably engage the bracket, and an orifice shaped to match the opening of the modular jack, so that the modular plug may pass through that orifice as it mates with the jack. The clip also has two opposing curved metal contacts along the perimeter of the orifice that engage and bear against the exposed shield portion of the modular plug as it mates with the modular jack. These contacts are as wide as the exposed shield portion of the plug, and are in parallel with each other (as well as with the internal ground contact). They are, however, relatively short, and are also stiff. The result is a significant reduction in the inductance of the ground path that tolerates repeated insertions and movement of the plug/cable combination after mating. A pair of metal tabs engage the opening of the modular jack to align, or register, the orifice in the clip with the opening of the jack, and prevent the clip from easily sliding along the bracket once registration has been achieved. Since the grounding clip is as wide as the bracket, when the circuit assembly (I/O board) having the bracket is installed in the chassis the clip contacts the chassis directly, just as the bracket does. But the clip is also in direct contact with the shield of the modular plug whenever it is connected to the jack. Thus the grounding clip provides stable and low inductance direct path from the shield on the modular plug to the chassis.

DESCRIPTION OF A PREFERRED EMBODIMENT

Figure 1:
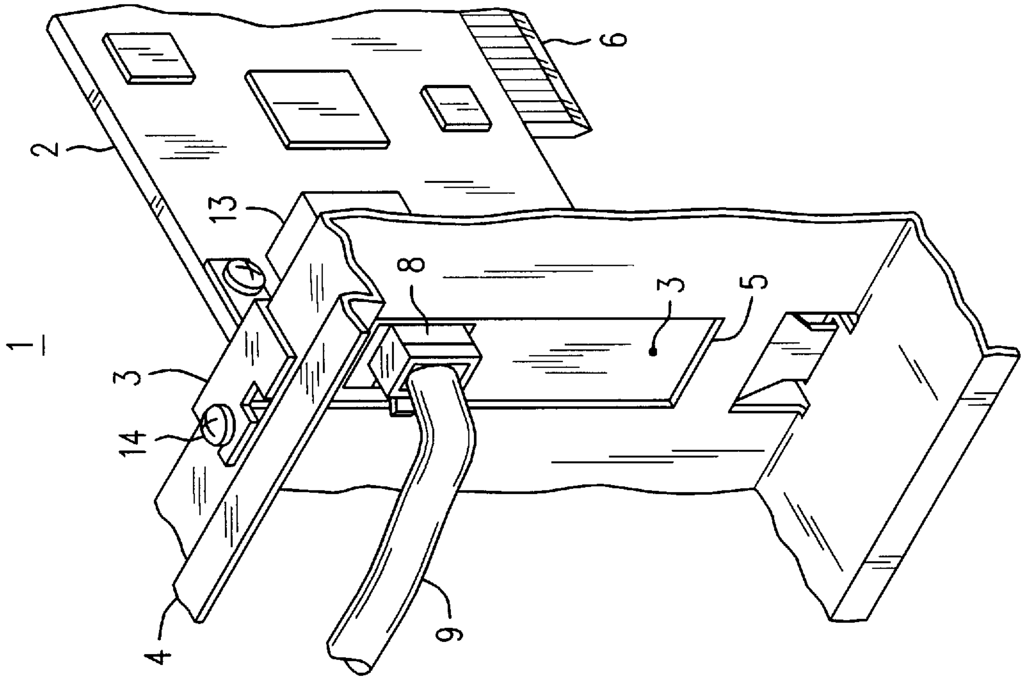
FIG. 1 (PRIOR ART)
FIG. 1 is a simplified perspective view of a prior art manner of connecting a shielded cable to an I/O card of a computer with a shielded modular connector.

Refer now to FIG. 1, wherein is shown a perspective view of a prior art manner 1 of connecting a shielded modular plug 8 to an I/O card or other circuit assembly 2 in a computer or other device (not shown). The shielded modular plug 8 is connected to a shielded cable 9 on one side, and mates with a shielded modular jack 13 carried by a circuit assembly 2. The shielded modular plug and jack may be of the RJ-45 variety. Circuit assembly 2 may be a printed circuit board having connector lands 6 that engage a connector carried by a mother board assembly (not shown). The circuit assembly 2 has attached at one end a bracket 3 that, when the circuit assembly is installed in the mother board, is aligned with and contacts a slot 5 in a panel 4 that is the chassis of the computer or other equipment. The circuit assembly 2 and its bracket 3 may be of the PCI/ISA style.

It will be appreciated that the ground path for the shield of the modular plug 8 passes through the jack 13, onto the circuit assembly 2, and thence via the bracket 3 to reach the chassis panel 4.

Figure 2:
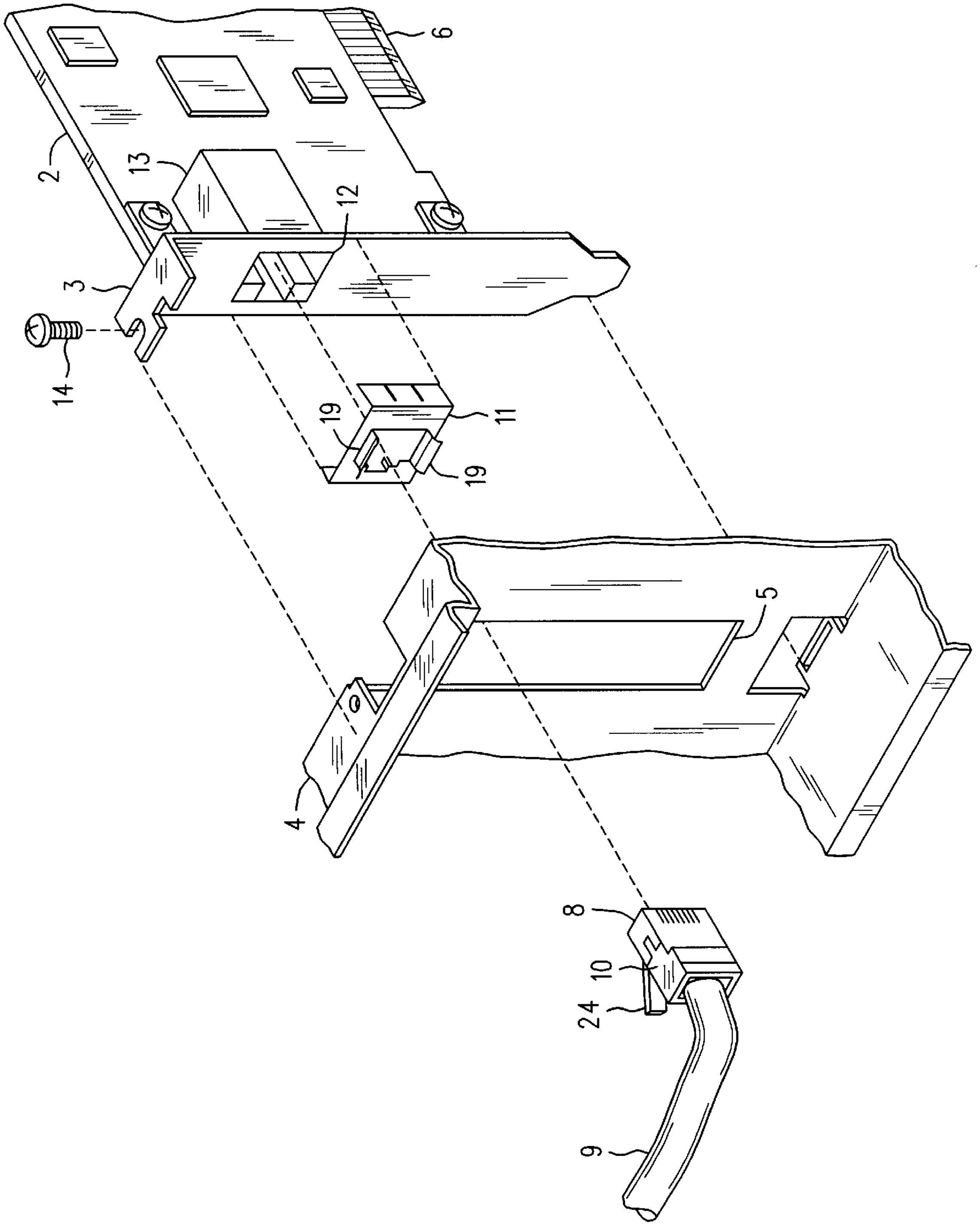
FIG. 2 is an exploded perspective view of an improved ground connection that is produced between a shielded modular plug and a chassis by a grounding clip.

The ground path for the modular plug 8 may be shortened and its reliability improved by use of the metallic grounding clip 11 shown in FIG. 2. It includes two fairly stiff but resilient metal contacts 19 that bear against, and reliably electrically connect to, the outer exposed shield portion 10 of the modular plug 8. The contacts 19 are as wide as the exposed shield portion 10, so as to reduce their inductance. Since they push toward each other, they do not lose electrical contact when the plug moves in the jack. They are also fairly short, and in parallel with each other, which also reduces the resulting inductance. The grounding clip 11 slips over the bracket 3 and has an orifice that aligns with the opening 12 in the modular jack 13. When the circuit assembly 2 is installed the bracket 3 is aligned with the slot 5, and the grounding clip 11 bears against the chassis metal surrounding that slot 5 to provide a direct electrical connection between the shield portion 10 of the modular plug 8 and the chassis 4.

Even if the grounding clip does not bear directly against the chassis, say because the bracket 3 is slightly bowed away from the slot 5 in that location, it is still connected at the top by the screw 14 that holds the installed circuit assembly in place. The shape of the bracket 3 is generally equivalent to that of the chassis, and is thus a low inductance path, anyway.

Figure 3:
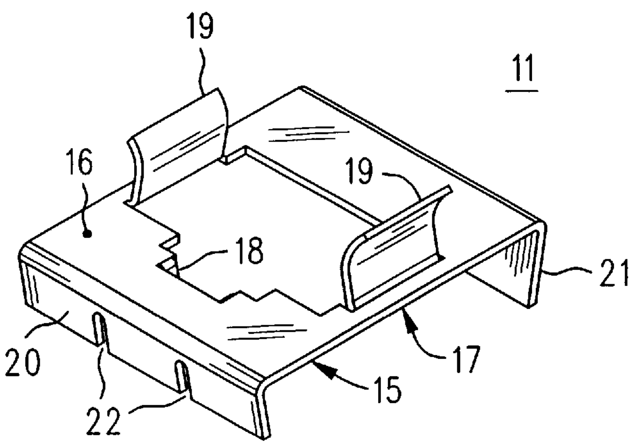
FIG. 3 is a front perspective view of the grounding clip of FIG. 2.
Figure 4:
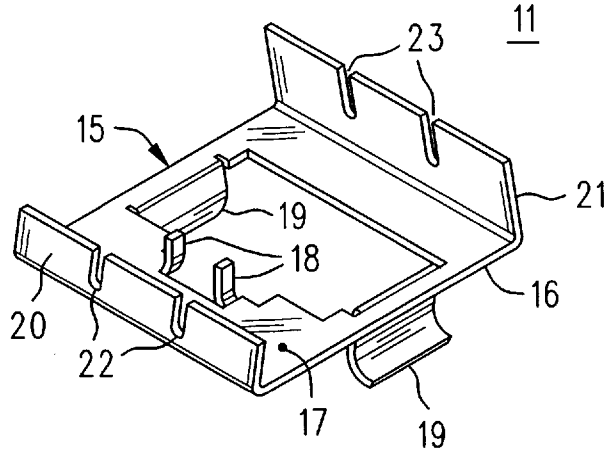
FIG. 4 is a rear perspective view of the grounding clip of FIG. 2.

The grounding clip 11 is depicted in greater detail in FIGS. 3 and 4. From those figures it may be seen that the grounding clip 11 is a shaped thin metal plate 15 that has plug surface side 16 and a jack surface side 17, which surfaces include an orifice therein that generally matches the shape of the opening of the shielded modular jack 13. Note the two opposing resilient metal contacts 19, which extend in a direction that is from the jack surface side toward the plug surface side. These metal contacts 19 are at a location along the periphery of the orifice that allow them to contact the exposed metallic shield portion 10 of the shielded modular plug 11. They are curved in such a manner that their outermost edges are farther apart than the modular plug 8, so that they engage it easily. Their middle portions curve inward, however, to make physical and electrical contact with exposed shield portion 10 as the plug 8 enters the jack 13.

Folded portions 20 and 21, each folded more than ninety degrees, allow the grounding clip 11 to grip the bracket 3. Folded portion 20 is shorter than folded portion 21 to allow a slight angling and twisting of the clip 11 as it is snapped over the bracket 3. To assist in this, the folded portion 20 includes slots 22, and folded portion 21 includes slots 23. These slots allow the folded portions 20 and 21 to act as collections of individual spring fingers, which further facilitates snapping the grounding clip 11 into place. Alternatively, if the tabs 18 (described below) are not too long, it is possible to simply slip the grounding clip 11 onto the end of the bracket 3 and simply push it up the length of the bracket 3 until the tabs 18 fall into place.

Note also tabs 18, bent in the opposite direction than contacts 19. Tabs 18 engage a portion of the opening in the modular jack 13 to align, or register, the grounding clip 11 such that the orifice therein is positioned directly in line with the opening of the modular jack 13. They generally straddle the location of the latching tang 24 (see FIG. 2) of the modular plug. These tabs 18 are thin enough that they do not interfere with the tang 24 as it enters the jack 13, but are long enough to prevent the grounding clip 11 from too easily sliding along the length of the bracket 3.

In a preferred embodiment grounding clip 11 is made of beryllium copper 0.010 inches thick that has been tin plated. Other finishes and other materials, such as stainless steel and brass are certainly possible. The preferred method of forming the grounding clip is stamping.

An article such as described herein has been manufactured and used in conjunction with a shielded RJ-45 modular plug and its jack to successfully reduce EMI from a 10Base-T Ethernet networking I/O card for a computer.

We claim:

1. A data communications assembly comprising:

a circuit assembly;

a shielded modular jack mounted to the circuit assembly and having an opening therein that receives a shielded modular plug;

a bracket mounted to the circuit assembly and having an opening therein aligned with and adjacent to the opening in the modular jack;

a grounding clip slidably attached to the bracket by folded portions that grip the edges of the bracket, that has an orifice therein shaped to generally match the opening in the shielded modular jack, that has a pair of folded tabs that aligns the orifice in the grounding clip to the opening in the shielded modular jack by extending into that opening, and that has a pair of resilient curved contacts that extend in a direction opposite that of the folded tabs and contact an exposed shield portion of a shielded modular plug.

2. A data communications assembly as in claim 1 wherein the shielded modular connector is RJ-45 and the circuit assembly is a networking I/O card.

3. An article of manufacture comprising a resilient metal plate having a jack side surface, a plug side surface parallel to the jack side surface and an orifice therethrough shaped to pass a modular plug, including two tabs along the perimeter of the orifice bent to extend in the direction of from the plug side surface toward the jack side surface, two opposing resilient metal contacts along the perimeter of the orifice bent to extend in the direction opposite that of the tabs and shaped to bear against, without obstructing, the sides of a modular plug, and two folds of greater than ninety degrees along two parallel opposing sides of the metal plate, the folded metal extending in the same direction as the two tabs.

4. An article of manufacture as in claim 3 wherein the folded metal extend by different amounts.

5. An article of manufacture as in claim 3 wherein the folded metal has slots therein extending from such a fold to the edge of the metal plate nearest that fold.

* * * * *